(12) United States Patent
Tomita et al.

(10) Patent No.: US 7,560,668 B2
(45) Date of Patent: Jul. 14, 2009

(54) SUBSTRATE PROCESSING DEVICE

(75) Inventors: Yasumitsu Tomita, Handa (JP); Yutaka Unno, Handa (JP)

(73) Assignee: NGK Insulators, Ltd., Nagoya-shi (JP)

( * ) Notice: Subject to any disclaimer, the term of this patent is extended or adjusted under 35 U.S.C. 154(b) by 406 days.

(21) Appl. No.: 11/443,703

(22) Filed: May 31, 2006

(65) Prior Publication Data
US 2006/0280875 A1 Dec. 14, 2006

Related U.S. Application Data

(60) Provisional application No. 60/687,248, filed on Jun. 2, 2005.

(51) Int. Cl.
*H05B 3/68* (2006.01)
*C23C 16/00* (2006.01)
(52) U.S. Cl. .................................. 219/444.1; 118/725
(58) Field of Classification Search .............. 219/444.1, 219/541–548; 118/724, 725
See application file for complete search history.

(56) References Cited

U.S. PATENT DOCUMENTS 5,478,429 A 12/1995 Komino et al.

| | | | |
|---|---|---|---|
| 2003/0029569 A1 | 2/2003 | Natsuhara et al. | |
| 2005/0022744 A1 | 2/2005 | Natsuhara et al. | |
| 2005/0077284 A1 * | 4/2005 | Natsuhara et al. | 219/444.1 |

FOREIGN PATENT DOCUMENTS

| EP | 0 506 391 | 9/1992 |
|---|---|---|
| EP | 1 249 859 | 10/2002 |
| EP | 1 291 903 | 3/2003 |
| JP | 11-026192 A1 | 1/1999 |
| WO | 9/50475 | 10/1999 |

OTHER PUBLICATIONS

Wright, D.R., et al., "Manufacturing issues of electrostatic chucks", 8257b Journal of Vacuum Science & Technology B 13 (1995), No. 4, New York, NY, US, Jul./Aug. 1995, pp. 1910-1916.

* cited by examiner

*Primary Examiner*—Sang Y Paik
(74) *Attorney, Agent, or Firm*—Burr & Brown

(57) ABSTRACT

A substrate processing device is provided, which includes a resistance heating element and a high-frequency electrode, to which a voltage is applied, a power supply member for a resistance heating element, and a power supply member for a high-frequency electrode, which supply power to the resistance heating element and the high-frequency electrode, respectively, a peripheral member disposed close to circumferences of the power supply members, and heat insulators arranged between the power supply members and the peripheral member and having heat resistance to a temperature at least higher than 250° C.

6 Claims, 1 Drawing Sheet

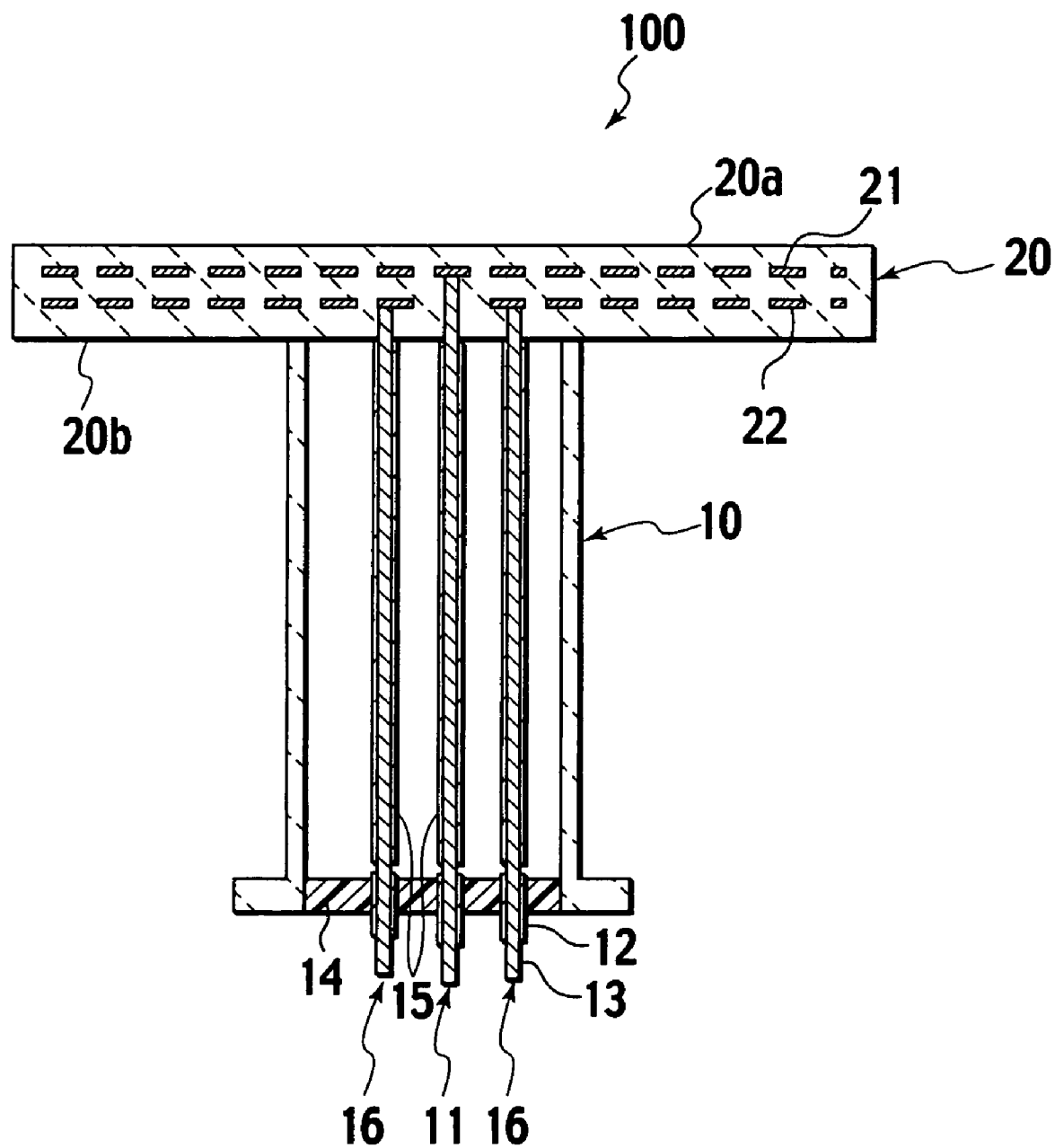

SUBSTRATE PROCESSING DEVICE

CROSS REFERENCE TO RELATED APPLICATIONS

This application is based upon and claims the benefit of priority from prior U.S. Provisional Application No. 60/687,248, filed on Jun. 2, 2005; the entire contents of which are incorporated herein by reference.

BACKGROUND OF THE INVENTION

1. Field of the Invention

The present invention relates to a substrate processing device which performs processing for a substrate (a silicon wafer).

2. Description of the Related Art

Heretofore, in semiconductor manufacturing liquid crystal device manufacturing processes, a substrate processing device has been used. The substrate processing device is a device which mounts a substrate on a holding surface of a ceramic base and performs processing such as heating for the substrate. There is also a substrate processing device which functions as a plasma generating device.

In the case of using the substrate processing device also as the plasma generating device, there are provided an RF electrode (a high-frequency electrode), and a power supply member for the RF electrode (for example, a Ni rod as a metal conductor), which supplies a high-frequency current to the RF electrode (for example, refer to Japanese Patent Laid-Open Publication No. H11-26192 published in 1999).

When a high-frequency voltage is applied to the power supply member, due to the skin effect, the current flows concentratedly through a surface of the power supply member (for example, the surface extends in a range from an outer circumferential surface of the power supply member to several-micron to several ten-micron deep), and the current hardly flows through a diametrical center of the power supply member.

Resistance of the power supply member is represented by the following equation (1). Since the current hardly flows through the diametrical center of the power supply member due to the skin effect as described above, an apparent cross sectional area S is decreased. As a result, the resistance R rises.

$$R = L/\sigma S \quad (1)$$

where
R: resistance;
L: length of power supply member;
σ: conductivity; and
S: cross-sectional area Meanwhile, the amount of heat generated by the power supply member is represented by the following equation (2). When the resistance R rises, the heat generation amount also increases.

$$W = RI^2 \quad (2)$$

where
W: heat generation amount;
R: resistance; and
I: current

As described above, when a high-frequency voltage is applied to the power supply member, there has been a problem that the amount of heat generated by the power supply member increases due to the skin effect.

Here, since many peripheral members arranged in the substrate processing device have complicated shapes, parts formed of resin, in which processability is good and electrical insulating properties are also excellent, are used as the peripheral members in many cases. However, since the peripheral members formed of resin have relatively low heat resistance, the possibility exists that the peripheral members may be damaged by the high-temperature power supply member. A specific description will be made below.

Even in the case of a heat-resistant resin said to have a high heat resistance among the resins, the heat resistant temperature thereof is approximately 250° C. Therefore, when a high-frequency current and large power of an alternating current are supplied through the power supply member to the electrode of the substrate processing device, the temperature of the power supply member reaches 250° C. or more, and there has been a possibility that the peripheral members (parts) formed of the resin are damaged.

Moreover, there is a substrate processing device including a resistance heating element, and a power supply member for the resistance heating element, which supplies a voltage to the resistance heating element, and the power supply member concerned is directly connected to the resistance heating element. Therefore, in the case of heating the substrate processing device to a high temperature, the power supply member is also heated to the high temperature due to heat transfer, and the possibility exists that the peripheral members formed of the resin are damaged.

In order to prevent such damage, it is conceivable to employ, as a material of the peripheral members, ceramics and the like which have heat resistance and which are less prone to cause thermal deformation. However, since it is difficult to process the ceramics, it is difficult to form the ceramics into the complicated shapes. Moreover, the ceramics are expensive. Therefore, it has been difficult to employ the ceramics.

SUMMARY OF THE INVENTION

It is an object of the present invention to provide a substrate processing device capable of reducing the damage of such a peripheral member when the power supply member generates heat.

In order to achieve the above-described object, a substrate processing device according to the present invention includes: a base having a member to be supplied with power; a power supply member which applies a voltage to the member to be supplied with power; a peripheral member disposed close to the power supply member; and a heat insulator disposed between the power supply member and the peripheral member and having heat resistance to a temperature at least higher than 250° C.

Since the heat insulator is provided in the substrate processing device according to the present invention, when the power supply member generates heat, heat transfer therefrom to the peripheral member can be decreased, and the damage to the peripheral member by the heat can be reduced to a large extent. Moreover, since the heat insulator has heat resistance to a temperature higher than 250° C., the heat insulator exerts a heat insulating effect without being deteriorated even if the temperature of the power supply member rises to more than 250° C.

BRIEF DESCRIPTION OF THE DRAWING

The FIGURE is a cross-sectional view of a substrate processing device according to an embodiment of the present invention.

DETAILED DESCRIPTION OF THE INVENTION

A description will be made of an embodiment of the present invention.

The FIGURE is a cross-sectional view showing a substrate processing device according to the embodiment of the present invention.

A substrate processing device 100 includes a ceramic base 20, a shaft 10, power supply members 11 and 16, and a peripheral member 14.

The ceramic base 20 is composed of AlN, SN, SiC, alumina, or the like, and formed to have a thickness of 0.5 to 30 mm. It is preferable that an outer shape of the ceramic base 20 be disc-like or polygonal.

Moreover, a surface of the ceramic base 20 is formed into a holding surface 20a. Then, in an inside of the ceramic base 20, a high-frequency electrode 21 is embedded on an upper side thereof, and a resistance heating element 22 is embedded below the high-frequency electrode 21. A power supply member 11 for a high-frequency electrode is coupled to the high-frequency electrode 21, and power supply members 16 for the resistance heating element are coupled to the resistance heating element 22. Thus, when a voltage is applied from the power supply members 16 for the resistance heating element to the resistance heating element 22, the resistance heating element 22 is heated up, and a substrate mounted on the holding surface 20a is subjected to a heating treatment by heat applied thereto. Note that the high-frequency electrode 21 and the resistance heating element 22, which are described above, are members to be supplied with power, which receive a supply of the power from the power supply members 11 and 16.

Moreover, the substrate processing device 100 functions also as a plasma processing device which generates plasma by applying a high-frequency voltage from the power supply members 16 for resistance heating element to the high-frequency electrode 21.

On a back surface 20b of the ceramic base 20 which constitutes the substrate processing device 100, a shaft 10 which supports the ceramic base 20 is provided. The shaft 10 is formed into a hollow cylinder or the like, and formed of aluminum nitride, silicon nitride, aluminum oxide, or the like.

An upper end of the shaft 10 is coupled to the back surface 20b of the ceramic base 20 by integral coupling, seal coupling, and the like. Note that, in the case of performing the seal coupling, an O-ring, a metal packing, and the like are used. Note that, when a gas introduction passage is formed on the back surface 20b of the ceramic base 20, the above-described coupling is performed while maintaining air tightness of the gas introduction passage.

On an inner circumference side of the shaft 10, the power supply member 11 for a high-frequency electrode and the power supply members 16 for a resistance heating element, which are as described above, are arranged.

High-frequency power is supplied to the high-frequency electrode 21 from the power supply member 11 for the high-frequency electrode, and the high-frequency electrode 21 generates the plasma. A mesh shape, a plate shape, and the like can be employed as the shape of the high-frequency electrode 21. The high-frequency electrode 21 may be formed by printing a conductive paste on a base material. The high-frequency electrode 21 has conductivity, and for example, it is preferable to form the high-frequency electrode 21 of W, Mo, WMo, WC, or the like.

The resistance heating element 22 generates heat by receiving a supply of a current from the power supply members 16, and heats up the substrate mounted on the holding surface 20a.

A mesh shape, a coil shape, a plate shape, or the like can be employed as a shape of the resistance heating element 22. The resistance heating element 22 can be formed by printing a conductive paste on a base material. The resistance heating element 22 has conductivity, and for example, it is preferable to form the resistance heating element 22 of W, Mo, WMo, WC, or the like.

Moreover, the power supply member 11 for the high-frequency electrode is formed of Ni, Al, Cu, or an alloy containing these metals, and as a shape of the power supply member 11 concerned, various shapes can be employed, which include a rod shape (stick shape), a column shape, a cable shape, a plate shape, a cord shape, and a cylinder shape. A connection terminal is provided on an upper end of the power supply member 11 for the high-frequency electrode, and the connection terminal is coupled to the high-frequency electrode by crimping, welding, brazing, soldering, and the like.

Moreover, upper ends of the power supply members 16 for the resistance heating element are directly connected to the resistance heating element 22 by brazing, welding, eutectic bonding, crimping, fitting, screwing, and the like.

Then, outer circumferential surfaces of upper portions (specifically, portions from the back surface 20b of the ceramic base 20 to the peripheral member 14) of the power supply member 11 for the high-frequency electrode and the power supply members 16 for the resistance heating element are covered with electrical insulating pipes 15 as heat insulators with electrical insulating properties.

Outer circumferential surfaces of lower ends of the power supply members 11 and 16 are covered with heat insulators 12 formed into a pipe shape. Meanwhile, on an inner circumference side of a lower end of the shaft 10, the disc-like peripheral member 14 is provided, and on the peripheral member 14, insertion holes are formed. The power supply member 11 for the high-frequency electrode and the power supply members 16 for the resistance heating element, which are covered with the heat insulators 12, are inserted into the insertion holes of the peripheral member 14. As described above, the lower ends of the power supply members 11 and 16 are fitted to the peripheral member 14 through the heat insulators 12.

Hence, even in the case where a voltage is applied to the power supply members 11 and 16, and the power supply members 11 and 16 generate heat, a discharge of the heat to the peripheries thereof is decreased by the heat insulators 12. Accordingly, damage to the peripheral member 14, which results from such heat generation, is decreased.

The heat insulators 12 have heat resistance to a temperature at least higher than 250° C., preferably, a temperature equal to or higher than 1000° C. According to this, even in the case where a voltage is applied to the power supply members 11 and 16, and the power supply members 11 and 16 are heated up to a temperature as high as approximately 250° C., transfer of the heat generated in the power supply members 11 and 16 to the peripheral member 14 is decreased efficiently, thus making it possible to restrict deformation of the peripheral member 14.

Moreover, if the heat resistant temperature of the heat insulators 12 is equal to or higher than 1000° C., even if the temperature of the power supply members 11 and 16 rises nearly to 1000° C., the heat insulators 12 can surely exert a heat insulating effect without being deformed, and so on.

Moreover, the thermal conductivity of the heat insulators 12 is preferably 100 W/m·K or less, more preferably, 50

W/m·K or less. According to this, the amount of the heat transferred from the power supply members 11 and 16 to the peripheral member 14 can be reduced, thus making it possible to restrict the deformation of the peripheral member 14.

It is preferable that the heat insulators 12 are formed of ceramics. Specifically, it is preferable that the heat insulators 12 are formed of alumina, zirconia, aluminum nitride, or the like. According to this, the heat insulators 12 having high heat insulating properties and heat resistance can be formed.

It is preferable that each of the heat insulators 12 is formed into a cylinder shape with a thickness of 0.3 mm or more. When each of the heat insulators 12 is formed into the cylinder shape with a thickness of 0.3 mm or more, breakage and the like thereof can be restricted while ensuring strength thereof.

The volume resistivity of the heat insulators 12 is preferably $10^{11}$ Ω·cm or more, more preferably, $10^{14}$ Ω·cm or more. Moreover, it is preferable that the heat insulators 12 are electrical insulators having a withstand voltage of 2 kV or more. According to this, the heat insulators 12 reduce the amount of current flowing from the power supply member 11 to the peripheral member 14, even if the temperature of the power supply member 11 rises, thus making it possible to operate the substrate processing device 100 appropriately, and to prevent the peripheral member 14 from generating the heat by the current.

Moreover, even if the peripheral member 14 is disposed adjacent to the power supply members 11 and 16 at an interval (distance) of 5 mm or less, since the heat insulators 12 are provided on the power supply members 11 and 16, the discharge of heat from the power supply members 11 and 16 to the peripheral member 14 is decreased, thus making it possible to reduce the damage owing to the heat transfer.

One example of a suitable material for the peripheral member 14 include polytetrafluoroethylene (trade name: Teflon) as one of fluorine resins, high-performance thermoplastic resin, or the like, and the material can be processed into a complicated shape. Moreover, it is preferable that the peripheral member 14 has electrical insulating properties.

As described above, the heat insulators 12 are provided between the peripheral member 14 and the power supply members 11 and 16, and thus the substrate processing device 100 can decrease the heat transfer from the power supply members 11 and 16 to the peripheral member 14 when the power supply members 11 and 16 generate the heat.

Note that the present invention is not limited to the above-described embodiment, and various alterations are possible. For example, the substrate processing device 100 may also be the one in which the high-frequency electrode 21 and the resistance heating element 22 are not embedded in the ceramic base 20, or the one in which the shaft 10 is not provided.

EXAMPLES

A specific description will be made of the present invention through Reference examples and Examples.

Reference Example

First, a description will be made of Reference examples serving as the premise of the present invention prior to the description of Examples. In the Reference examples, the distance between the power supply members and the peripheral member was changed as appropriate, and it was verified whether or not thermal deformation occurred in the peripheral member. In the Reference examples, though the substrate processing device shown in the FIGURE was used, the heat insulators 12 were not provided for the power supply members.

A high-frequency voltage with a frequency of 13.56 MHz and power of 2000 W was applied to the power supply members for 40 minutes. Then, the temperature of the peripheral member was verified, and it was determined whether or not the thermal deformation occurred in the peripheral member. A thermal tape at a temperature of 250° was pasted to a region of the peripheral member which is the closest to the power supply member, and a change of color of the thermal tape was confirmed. Thus, the temperature of the peripheral member was measured. Moreover, it was visually determined whether or not thermal deformation of the peripheral member occurred. Verification results of the Reference examples are shown in Table 1.

Table 1

TABLE 1

| | | REFERENCE EXAMPLE 1 | REFERENCE EXAMPLE 2 | REFERENCE EXAMPLE 3 | REFERENCE EXAMPLE 4 |
|---|---|---|---|---|---|
| PERIPHERAL MEMBER | MATERIAL | THERMOPLASTIC RESIN | | | |
| | MAXIMUM CONTINUOUS USE TEMPERATURE [° C.] | 250 | | | |
| DISTANCE BETWEEN POWER SUPPLY MEMBER AND PERIPHERAL MEMBER [mm] | | 1 | 3 | 5 | 7 |
| TEMPERATURE OF PERIPHERAL MEMBER [° C.] | | >250 | >250 | >250 | <250 |
| THERMAL DEFORMATION OF PERIPHERAL MEMBER | | PRESENT | PRESENT | PRESENT | NONE (THERMAL DEFORMATION IS PRESENT IN CLOSEST REGION TO POWER SUPPLY MEMBER) |

As shown in Table 1, in Reference examples 1 to 4, a peripheral member was used, in which the material is the thermoplastic resin, and the maximum temperature (the maximum continuous use temperature) at which the peripheral member is continuously usable is 250° C.

Note that, in Reference examples 1 to 4, the distance between the power supply members and the peripheral member was set at 1 mm, 3 mm, 5 mm, and 7 mm, respectively.

A brief description will be made of the results of the Reference examples.

While the temperature of the peripheral member rose more than 250° C. in Reference examples 1 to 3, the temperature of the peripheral member was lower than 250° C. in Reference example 4.

Moreover, in each of Reference examples 1 and 2, thermal deformation occurred in the peripheral member, and breakage occurred in the substrate processing device. In Reference example 3, though thermal deformation occurred in the peripheral member, no breakage occurred in the substrate processing device.

In Reference example 4, though the temperature of the peripheral member was lower than 250° C., the capability to hold the power supply members by the peripheral member was decreased, and the power supply members were held in an inclined manner. The distance at which the inclined power supply members and the peripheral member came closest to each other was less than 5 mm, and in a region where the power supply members and the peripheral member came closest to each other, thermal deformation occurred in the peripheral member.

From the results of Reference examples 1 to 4 described above, it was proven that there occurred thermal deformation of the peripheral member, breakage of the substrate processing device, and the like due to heat generation of the power supply members when the peripheral member was arranged adjacent to the power supply members at the distance of 5 mm or less.

Examples

Subsequently, a description will be made of the Examples according to the present invention. In the Examples, the substrate processing device used in the Reference examples described above was used, and for the power supply members of the substrate processing device, the heat insulators were provided. Specifically, the thermoplastic resin in which the maximum continuous use temperature is 250° C. was used for the peripheral member, and the distance between the power supply members and the peripheral member was set at 3 mm.

In the Examples, heat insulators composed of three types of materials were used, and the temperature of the peripheral member, the thermal deformation of the peripheral member, and the thermal deformation of the heat insulators were verified. Results of the verification are shown below in Table 2.

Table 2

The heat insulators were formed into a cylinder shape with a thickness of 1 mm. For the materials of the heat insulators in Examples 1 and 2 and Comparative Example 1, $Al_2O_3$, AlN, and polytetrafluoroethylene (trade name: Teflon) were used, respectively.

A high-frequency voltage with a frequency of 13.56 MHz and power of 2000 W was applied to the power supply members for 40 minutes. Then, the temperature of the peripheral member, the thermal deformation of the peripheral member, and the thermal deformation of the heat insulators were verified.

The temperature and thermal deformation of the peripheral member were verified in the same way as in the case of the Reference examples described above. Moreover, the thermal deformation of the heat insulators was visually confirmed.

In Examples 1 and 2, no thermal deformation occurred in either one of the peripheral member or the heat insulators, and no malfunction or the like of the substrate processing device occurred. However, in Comparative Example 1, though no thermal deformation of the peripheral member occurred, the heat insulators were thermally deformed and inhibited thermal expansion of the power supply members. Accordingly, a malfunction occurred in the substrate processing device.

From the results of Examples 1 and 2 and Comparative Example 1, which are as described above, the following was proven. Specifically, by arranging the heat insulators provided with a heat resistance to temperatures higher than 250° C. between the peripheral member and the power supply members, the heat transfer from the power supply members to the peripheral member can be decreased, thus making it possible to reduce damage to the peripheral member. Moreover, it was proven that damage to the substrate processing device can thus be prevented.

The invention claimed is:

1. A substrate processing device, comprising:
   a ceramic base including at least one member to be supplied with power;
   at least one power supply member, which applies a voltage to the member to be supplied with power, provided in the base;
   a peripheral member disposed close to the power supply member;
   a heat insulator surrounding a portion of the power supply member, disposed between the power supply member and the peripheral member, and having heat resistance to a temperature at least higher than 250° C.;

TABLE 2

|  |  | EXAMPLE 1 | EXAMPLE 2 | COMPARATIVE EXAMPLE 1 |
|---|---|---|---|---|
| HEAT INSULATING MATERIAL | MATERIAL | $Al_2O_3$ CERAMICS | AlN CERAMICS | POLYTETRA-FLUOROETHYLENE |
|  | THICKNESS OF HEAT INSULATING MATERIAL [mm] | 1 | 1 | 1 |
|  | MAXIMUM CONTINUOUS USE TEMPERATURE [° C.] | >1000 | >1000 | 250 |
|  | THERMAL CONDUCTIVITY [W/m · k] | 35 | 100 | 0.25 |
|  | VOLUME RESISTIVITY (ROOM TEMPERATURE) [Ω · cm] | >1E+16 | 1E+15 | >1E+18 |
|  | WITHSTAND VOLTAGE [kV/mm] | >2 | >2 | >2 |
| TEMPERATURE OF PERIPHERAL MATERIAL [° C.] |  | <250 | <250 | <250 |
| THERMAL DEFORMATION OF PERIPHERAL MEMBER |  | NONE | NONE | NONE |
| THERMAL DEFORMATION OF HEAT INSULATING MATERIAL |  | NONE | NONE | PRESENT |
| EFFECT |  | ○ | ○ | X | an insulating pipe surrounding another portion of the power supply member and which is separated from both the heat insulator and the peripheral member; and a shaft supporting the ceramic base and comprising a hollow cylinder made of a material selected from the group consisting of aluminum nitride, silicon nitride and aluminum oxide;

wherein the peripheral member is provided on an inner circumferential surface of a lower end of the shaft;

wherein a lower end of the power supply member is fitted to the peripheral member through the heat insulating member; and wherein at least a part of the peripheral member is disposed adjacent to the power supply member at a distance of 5 mm or less.

2. The substrate processing device according to claim 1, wherein the member to be supplied with power is at least one of a resistance heating element and a high-frequency electrode.

3. The substrate processing device according to claim 1, wherein a thermal conductivity of the heat insulator is 50 W/m·K or less.

4. The substrate processing device according to claim 1, wherein the heat insulator is an electrical insulator.

5. The substrate processing device according to claim 4, wherein the electrical insulator is a ceramic.

6. The substrate processing device according to claim 1, wherein a withstand voltage of the heat insulator is 2 kV or more.

* * * * *